United States Patent [19]

Vahabi et al.

[11] Patent Number: 5,446,742
[45] Date of Patent: Aug. 29, 1995

[54] TECHNIQUES FOR DEVELOPING INTEGRATED CIRCUIT TEST PROGRAMS AND THEIR USE IN TESTING ACTUAL CIRCUITS

[75] Inventors: Mahammadreza Vahabi, Milpitas; Alfred Kohanteb, Campbell, both of Calif.

[73] Assignee: Zilog, Inc., Campbell, Calif.

[21] Appl. No.: 561,297

[22] Filed: Aug. 1, 1990

[51] Int. Cl.$^6$ ............................................. G06F 11/00
[52] U.S. Cl. ...................................... 371/27; 371/25.1
[58] Field of Search .................. 371/27, 67.1, 22.1, 371/21.3, 19, 61, 22.4, 22.6, 23, 22.3, 25.1; 364/488 MS, 578 MS; 395/375

[56] References Cited

U.S. PATENT DOCUMENTS

| | | | |
|---|---|---|---|
| 4,194,113 | 3/1980 | Fulks et al. | 371/22.4 |
| 4,513,394 | 4/1985 | Deyer | 364/900 |
| 4,541,071 | 9/1985 | Ohmori | 364/900 |
| 4,602,210 | 7/1986 | Fasang et al. | 371/22.3 |
| 4,730,319 | 3/1988 | David et al. | 371/27 |
| 4,736,375 | 4/1988 | Tannhäuser et al. | 371/27 |
| 4,771,428 | 9/1988 | Acuff et al. | 371/25.1 |
| 4,849,928 | 7/1989 | Hauck | 395/500 |
| 4,855,669 | 8/1989 | Mahoney | 324/73 R |
| 4,862,067 | 8/1989 | Brune et al. | 324/73.1 |
| 4,994,732 | 2/1991 | Jeffrey et al. | 371/27 |
| 5,084,824 | 1/1992 | Lam et al. | 364/488 |
| 5,097,468 | 3/1992 | Earlie | 371/15.1 |

Primary Examiner—Robert W. Beausoliel, Jr.
Assistant Examiner—Phung My Chung
Attorney, Agent, or Firm—Majestic, Parsons, Siebert & Hsue

[57] ABSTRACT

A computer process for developing a test program and data for use on automatic test equipment ("ATE") to test the logical function of actual integrated circuits. The separate trace files usually developed by the designer of a particular circuit in order to simulate the circuit's logical operation are utilized to produce the test program and data for controlling the ATE's testing of that circuit. The computer implemented process for doing so includes separate preliminary processing, related to the trace files but essentially unrelated to the particular ATE used, and post processing, for converting the intermediate results of the preliminary processing into a test program and data for driving a particular type of ATE. The process includes the use of common timing files for data from the plurality of trace files, and conversion of a binary integer representation of timing edges to ASCII characters with a significantly reduced number of bits.

6 Claims, 14 Drawing Sheets

Microfiche Appendix Included
(14 Microfiche, 70 Pages)

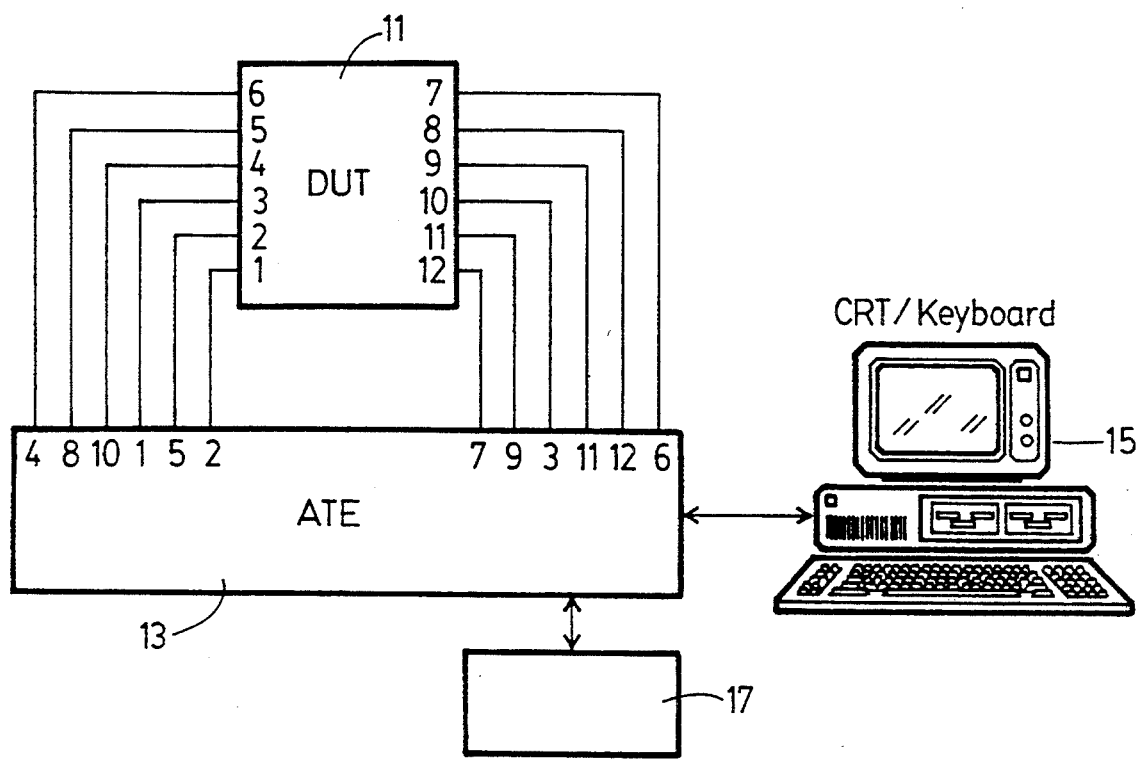
FIG._1.
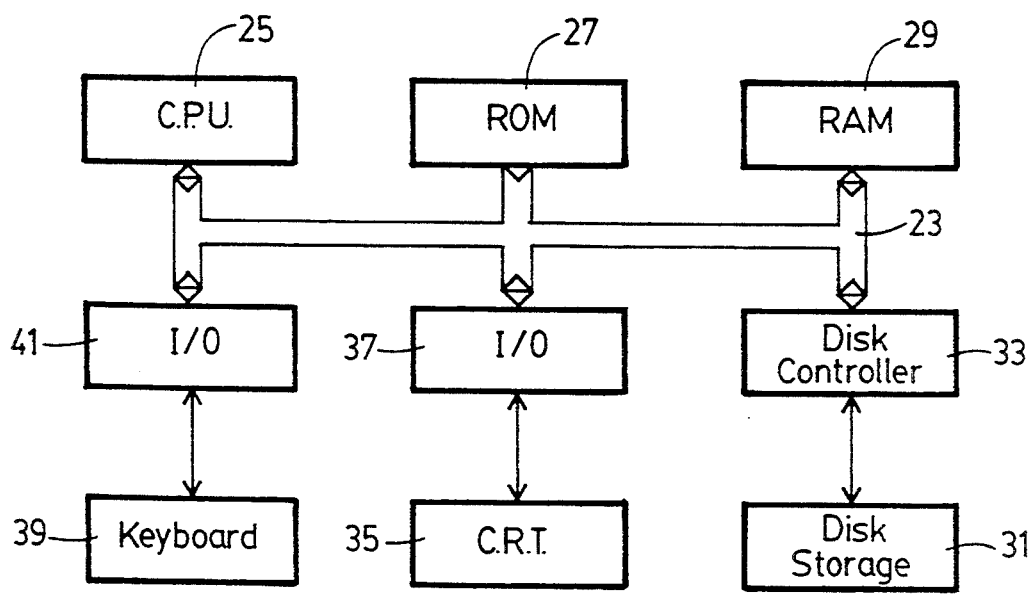
FIG._2.

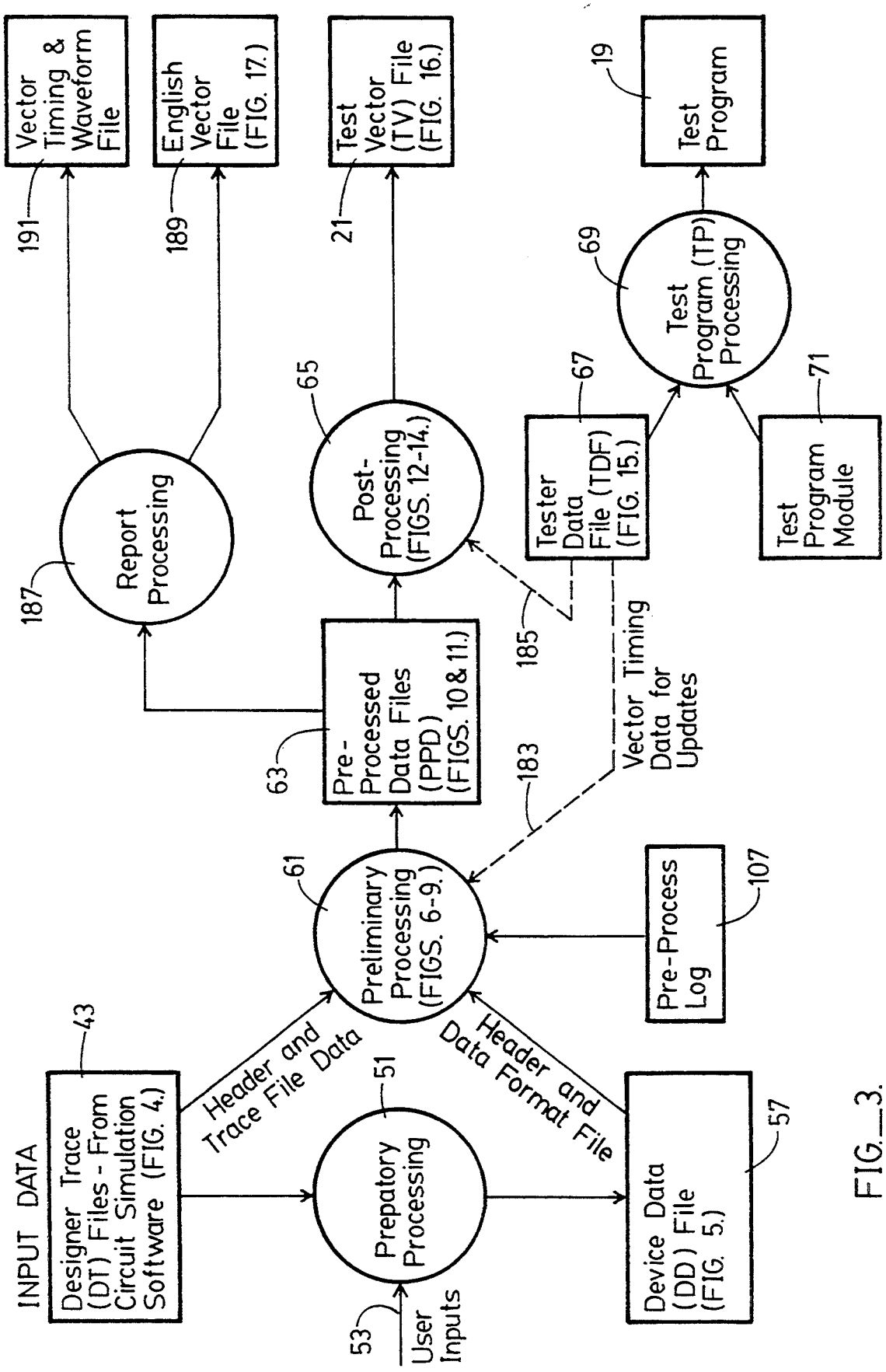
FIG._3.

I HEADER

General Information: _____

Simulator Version: VTI Version 3.0 ←— 43
Target Tester: Sentry 20/21
Tester Cycle: 100 n sec
Total No. of Pins: 12

II DATA FORMAT

↙ 45

| Signal Ref. # | Signal Name | Pin Type | Logic Level | Open Drain | Time1 (n sec) | Time2 (n sec) | Strobe (n sec) | Package Pin # |
|---|---|---|---|---|---|---|---|---|
| 1. | AD0 | I/O | CMOS | N/A | | | | 1 |
| 2. | AD1 | I/O | CMOS | N/A | | | | 2 |
| 3. | AD2 | I/O | CMOS | N/A | | | | 12 |
| 4. | AD3 | I/O | CMOS | N/A | | | | 11 |
| 5. | *TAD | CTL | N/A | N/A | | | | N/A |
| 6. | R/W | I | TTL | N/A | 110E-9 | 170E-9 | | 4 |
| 7. | OUT | O | CMOS | U2 | | | 080E-9 | 3 |
| 8. | *MOUT | CTL | N/A | N/A | | | | N/A |
| 9. | $V_{DD}$ | PWR | N/A | N/A | | | | 6 |
| 10. | $V_{SS}$ | PWR | N/A | N/A | | | | 7 |
| 11.-14. | ?ADC | O | CMOS | N/A | | | | 5,8,9,10 |

III DESIGNER TRACE FILES

| | Time (n sec) | Vector | |
|---|---|---|---|
| TEST NO. 1: | 0.0 | 1 1 0 0 1 0 U 1 1 0 A | ⎫ |
| (Raw Test | 26.5 | 1 0 0 0 1 1 U 1 1 0 A | ⎬ Cycle # 1 |
| Vector Data) | 85.0 | 1 1 0 0 1 0 U 1 1 0 A | ⎭ |
| | 140.7 | 0 1 0 0 1 0 1 0 1 0 A | ⎫ Cycle # 2 |
| | 195.0 | 1 1 0 0 1 1 0 0 1 0 C | ⎭ |
| | 244.7 | 1 1 1 1 1 0 0 1 1 0 C | ⎬ Cycle # 3 |
| | 320.0 | 1 1 0 0 1 0 1 1 1 0 C | |
| TEST NO. 2: | 0.0 | 1 1 1 0 0 1 0 0 1 0 U | ←— 49 |
| (Raw Test | 12.3 | 0 1 1 0 0 1 1 0 1 0 U | |
| Vector Data) | 25.7 | 1 0 1 1 0 1 0 0 1 0 A | |
| | 42.0 | 1 0 1 0 0 1 1 0 1 0 A | |

I HEADER

General Information: _____

Simulator Version: VTI Version 3.0  ← 43'
Target Tester: Sentry 20/21
Tester Cycle: 100 n sec.
Total No. of Pins: 12

II DATA FORMAT (TABLE A)   59

| Signal Ref.# | Signal Name | Pin Type | Logic Level | Open Drain | Time1 (n sec) | Time2 (n sec) | Strobe (n sec) | Package Pin # | Tester Pin # |
|---|---|---|---|---|---|---|---|---|---|
| 1. | AD0 | I/O | CMOS | N/A | | | | 1 | 2 |
| 2. | AD1 | I/O | CMOS | N/A | | | | 2 | 5 |
| 3. | AD2 | I/O | CMOS | N/A | | | | 12 | 7 |
| 4. | AD3 | I/O | CMOS | N/A | | | | 11 | 9 |
| 5. | *TAD | CTL | N/A | N/A | | | | N/A | N/A |
| 6. | R/W | I | TTL | N/A | 110E-9 | 170E-9 | | 4 | 10 |
| 7. | OUT | O | CMOS | U2 | | | 080E-9 | 3 | 1 |
| 8. | *MOUT | CTL | N/A | N/A | | | | N/A | N/A |
| 9. | $V_{DD}$ | PWR | N/A | N/A | | | | 6 | 4 |
| 10. | $V_{SS}$ | PWR | N/A | N/A | | | | 7 | 6 |
| 11. | ADC | O | CMOS | N/A | | | | 5 | 8 |
| 12. | ADC | O | CMOS | N/A | | | | 8 | 12 |
| 13. | ADC | O | CMOS | N/A | | | | 9 | 11 |
| 14. | ADC | O | CMOS | N/A | | | | 10 | 3 |

III DATA FORMAT (TABLE B)   55

| Signal Ref.# | Pin Format | INPUT | | | | STROBE | | | | Reference Supply |
|---|---|---|---|---|---|---|---|---|---|---|
| | | TS | TG | Start | Stop | TS | TG | Start | Stop | |

FIG._5.

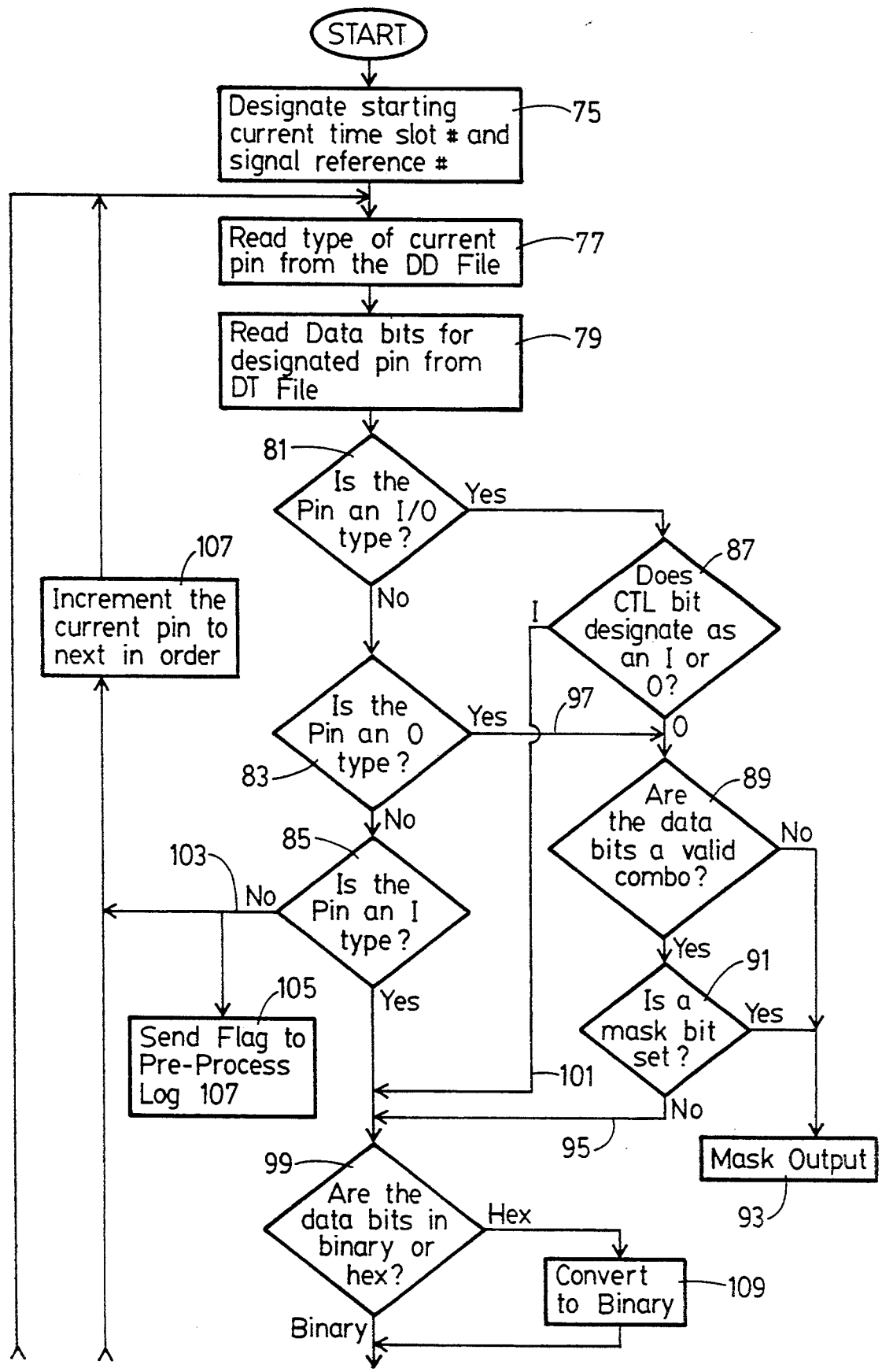
FIG._6A.1.

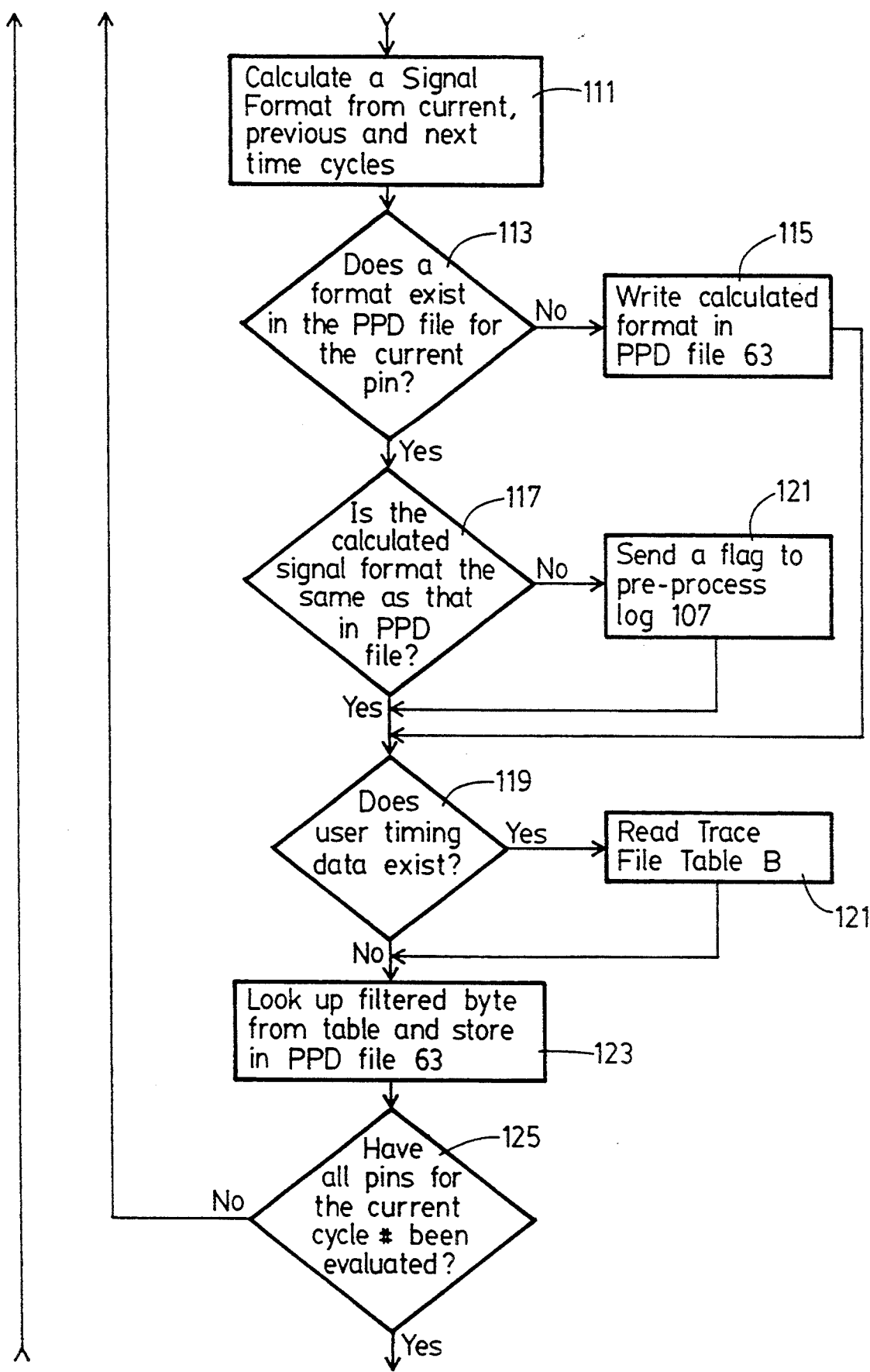
FIG._6A.2.

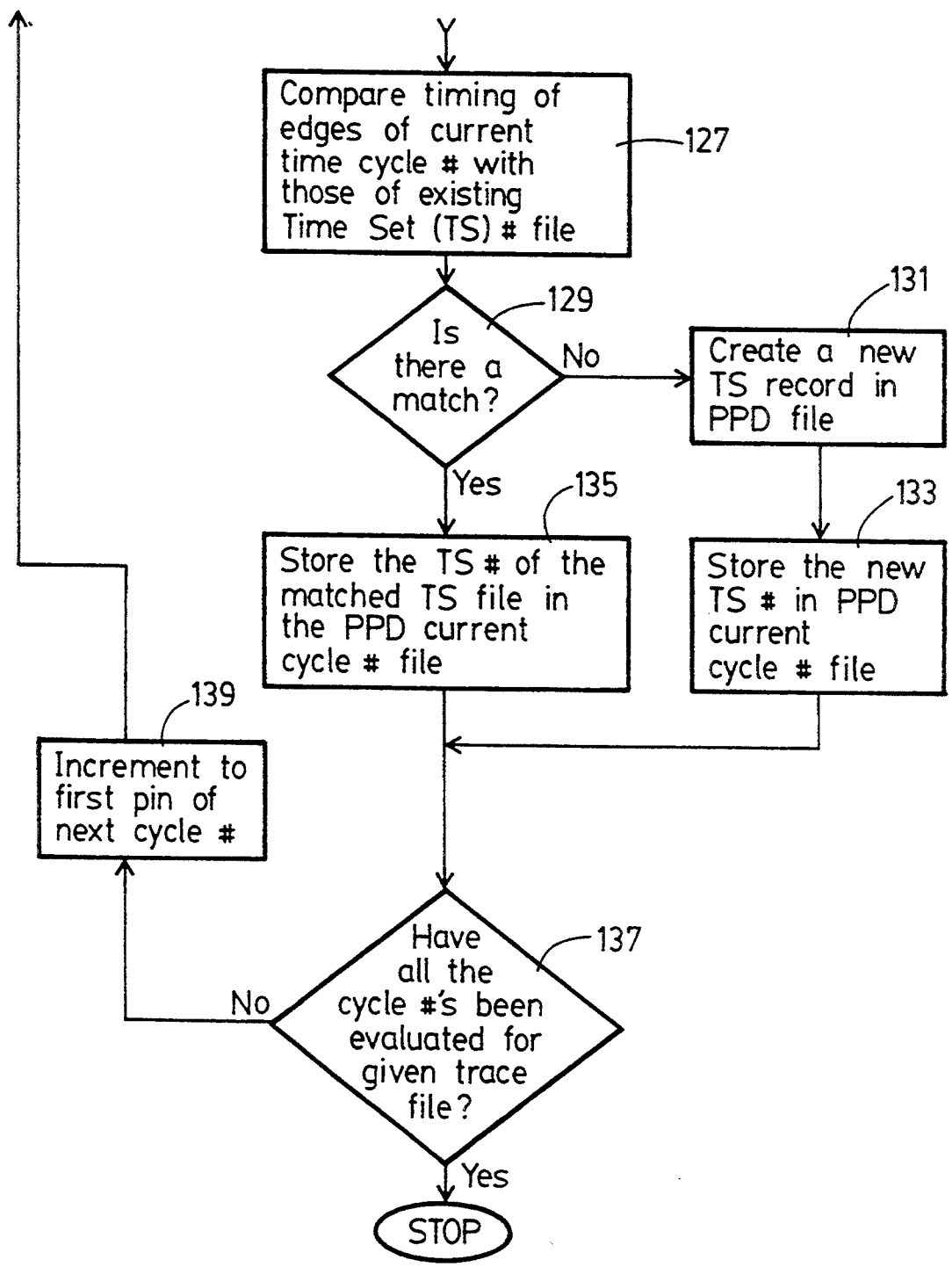
FIG._6B.

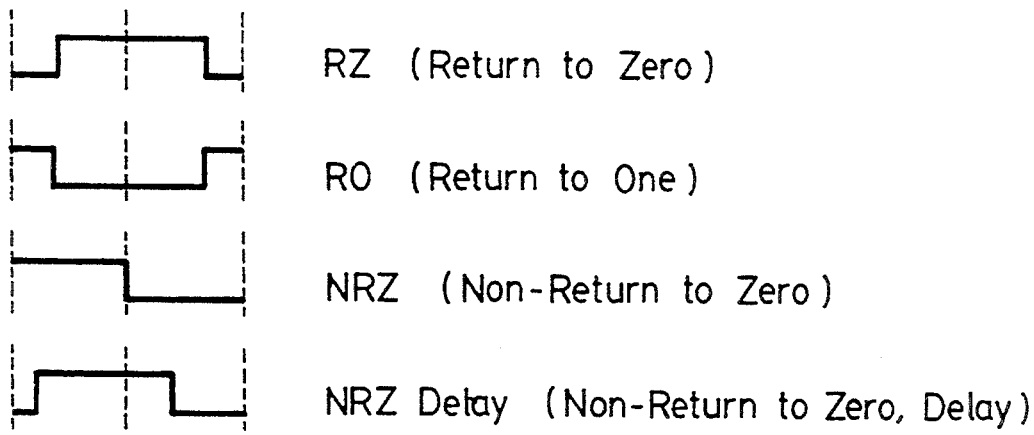
FIG._7.
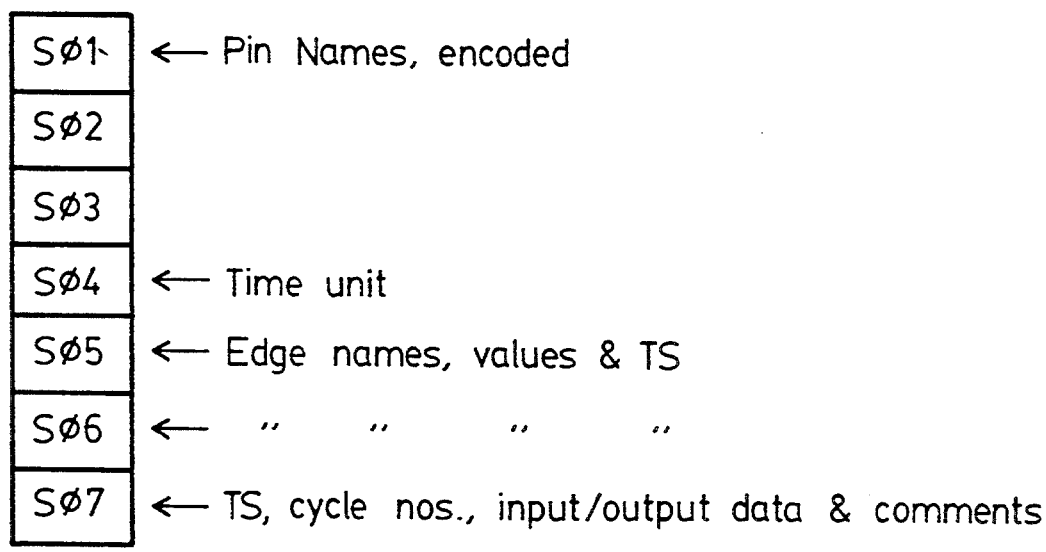
FIG._10.
| Cycle # | TS # | Input/Output Data | Comments |
|---|---|---|---|
| 1 | 1 | 1 ∅ ∅ ∅ 1 u 1 ∅ H L H L | |
| 2 | 2 | ∅ 1 ∅ ∅ 1 u ∅ 1 H H L L | |
| ⋮ | ⋮ | ⋮ | |
FIG._11.

| (1) Pin Data Bits | (2) Value if Input Pin and Valid | (3) Value if Output Pin and Valid | (4) Value if Not Valid |
|---|---|---|---|
| 0 0 0 | 0 | L | M |
| 0 0 1 | 1 | H | Z |
| 0 1 0 | 1 | H | Z |
| 0 1 1 | 1 | H | Z |
| 1 0 0 | 0 | L | M |
| 1 0 1 | 0 | L | M |
| 1 1 0 | 0 | L | M |
| 1 1 1 | 1 | H | Z |

FIG._8.

| Signal Ref. # | | | | | | | | | | | | |
|---|---|---|---|---|---|---|---|---|---|---|---|---|
| 1 | 2 | 3 | 4 | 6 | 7 | 9 | 10 | 11 | 12 | 13 | 14 | |
| 1 | 1 | 0 | 0 | 0 | u | 1 | 0 | 1 | 0 | 1 | 0 | ⎫ Raw Data, |
| 1 | 0 | 0 | 0 | 1 | u | 1 | 0 | 1 | 0 | 1 | 0 | ⎬ time cycle #1 |
| 1 | 1 | 0 | 0 | 0 | u | 1 | 0 | 1 | 0 | 1 | 0 | ⎭ |
| 1 | 0 | 0 | 0 | 1 | u | 1 | 0 | H | L | H | L | ← Filtered Data |

FIG._9.

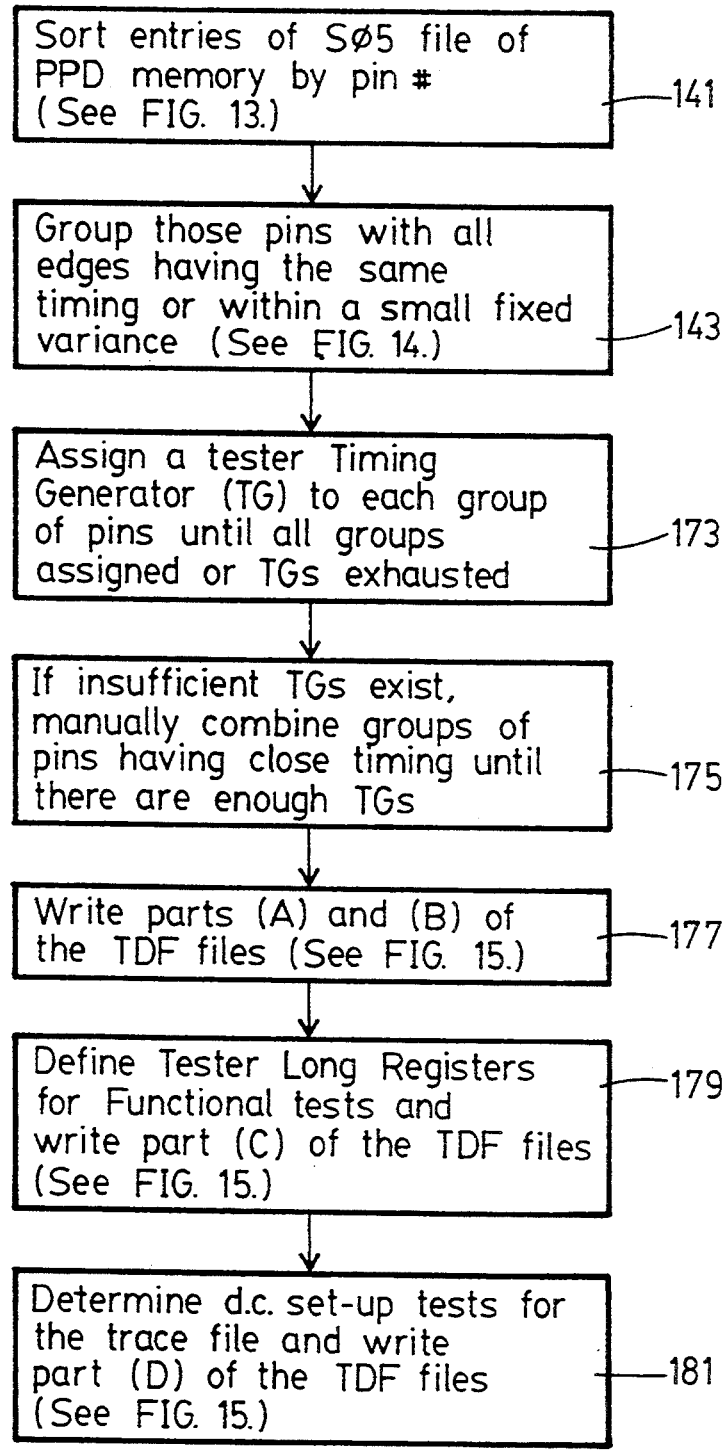
FIG._12.

| Pin # | Time Set 1 | Time Set 2 |
|---|---|---|
| 1 | - | 40.7 95.0 |
| 2 | 26.5 85.0 | |
| 3 | - | - |
| 4 | 26.5 85.0 | 95.0 |
| ⋮ | ⋮ | ⋮ |

| TS | Tester Pin # | TG Input | TG Output | Edge E0 | Edge E1 | Edge E2 | Edge E3 | Group # Input | Group # Output |
|---|---|---|---|---|---|---|---|---|---|
| 1 | 2 | 1(TGIA) | -1 | 26.5 | 85.0 | -1 | -1 | 1 | -1 |
| 1 | 4 | 1 | -1 | 26.5 | 85.0 | -1 | -1 | 1 | -1 |
| 1 | 1 | -1 | -1 | -1 | -1 | -1 | -1 | -1 | -1 |
| ⋮ | ⋮ | ⋮ | ⋮ | ⋮ | ⋮ | ⋮ | ⋮ | ⋮ | ⋮ |

(B)

| | Tester Pin Nos. | | | |
|---|---|---|---|---|
| | 1-8 | 9-15 | 16-23 | 24-30 |
| TG1: | A | X | B | B --- |
| TG2: | A | A | A | X --- |
| | ⋮ | | ⋮ | |

(C) Long Registers Contents (D) D.C. Set-up test data

FIG._15.

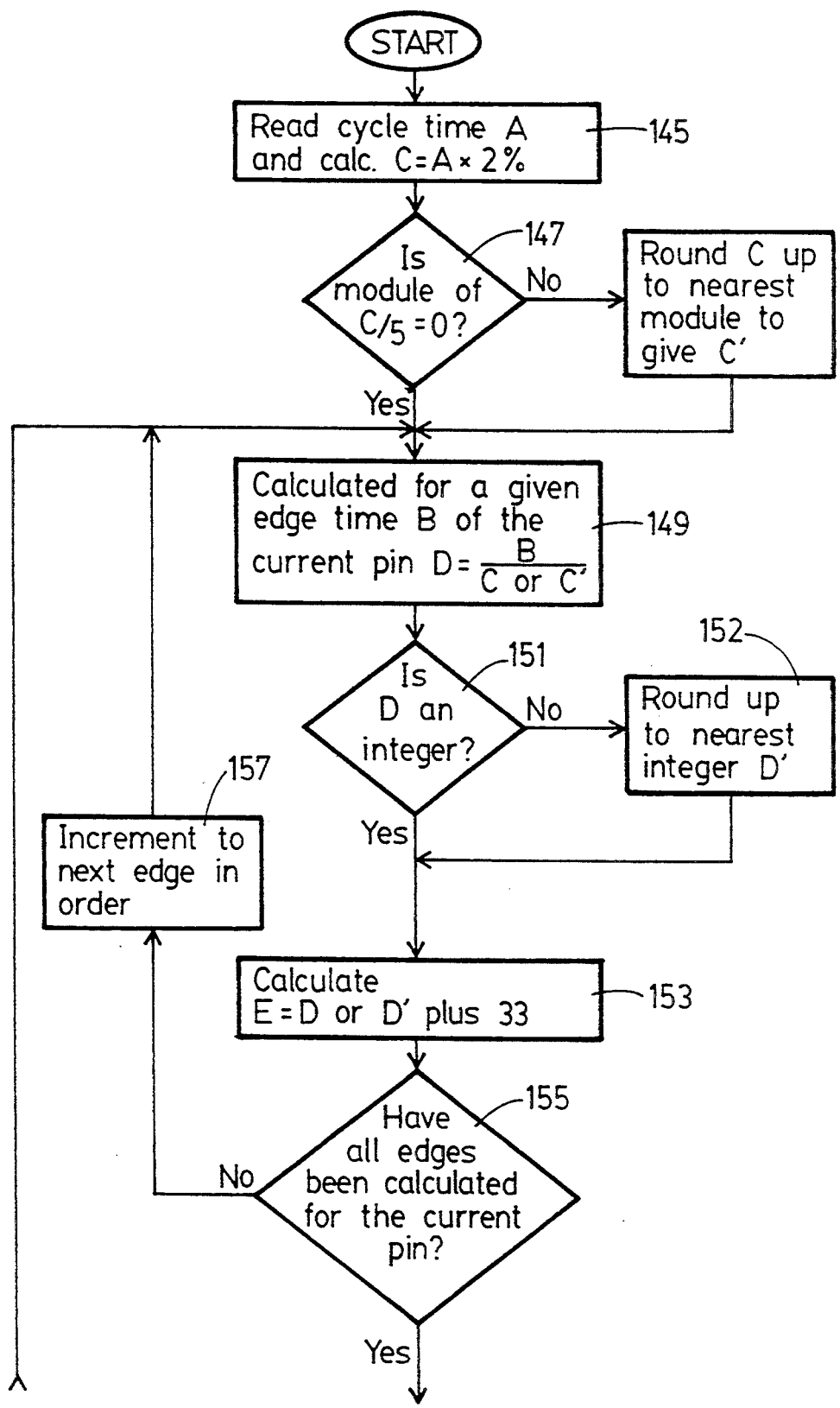
FIG._14.1.

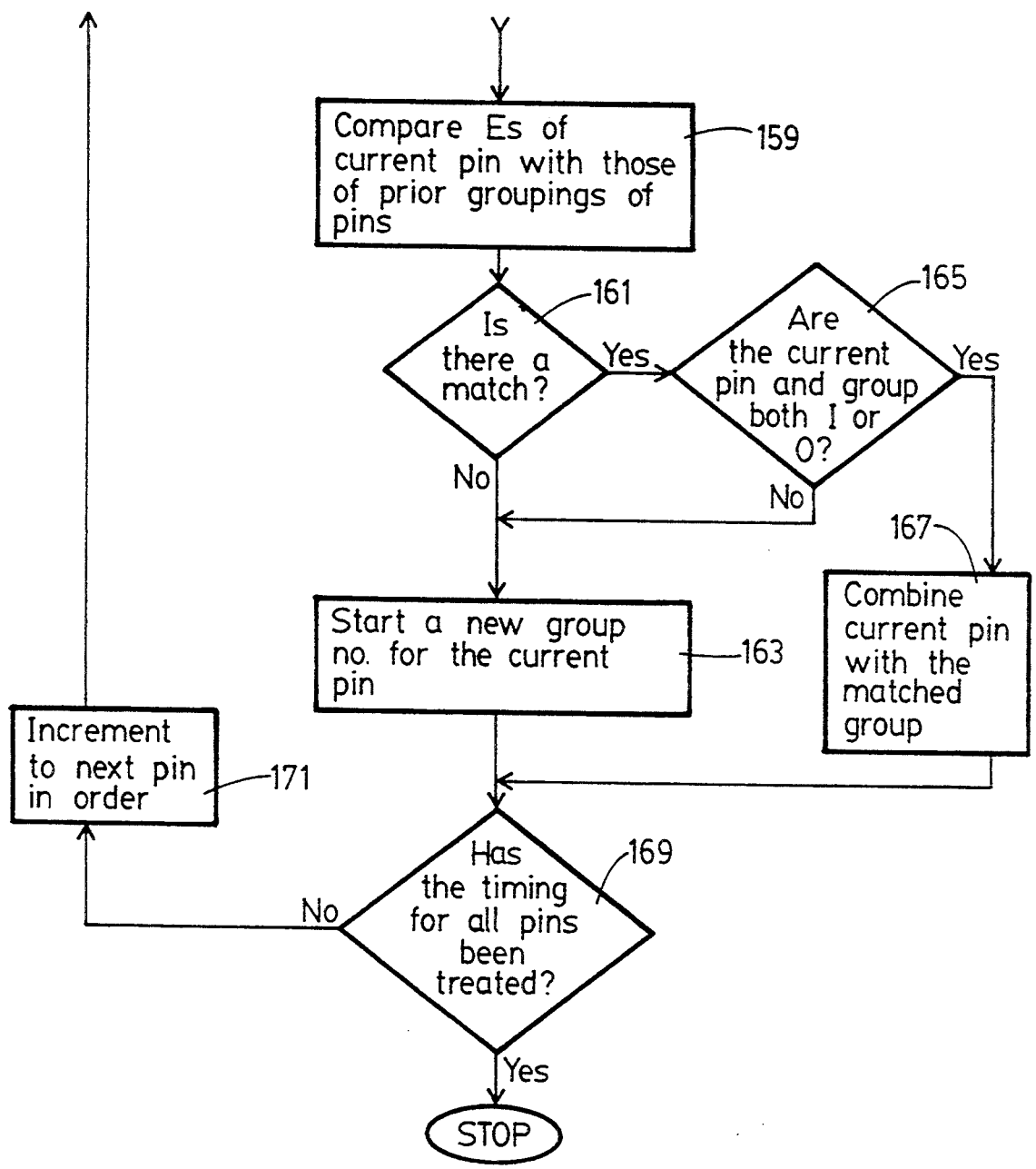
FIG._14.2.

Cycle #1 ; Set F 1 1 1 1 1 1 1 1 1   ∅ ∅ ∅ ∅ ∅ ∅ ∅ ∅ ∅   ----

Cycle #6 ; Set FC4

| Vector # | FC | TS | Filtered Data | |
|---|---|---|---|---|
| 0 | - | 1 | 1 ∅ 1 1 1 ∅ | ---- |
| 1 | - | 1 | 1 1 1 ∅ ∅ 1 | ---- |
| 4 | 3 | 2 | ∅ ∅ ∅ ∅ 1 1 | ---- |

FIG._17.

TECHNIQUES FOR DEVELOPING INTEGRATED CIRCUIT TEST PROGRAMS AND THEIR USE IN TESTING ACTUAL CIRCUITS

REFERENCE TO APPENDIX

An appendix to this application consists of 14 microfiche cards containing a computer program, in source code, of approximately 800 pages in length.

BACKGROUND OF THE INVENTION

This invention relates generally to the art of testing packaged integrated circuits, and, more specifically, to techniques for developing test programs useful with existing automatic test equipment for testing such circuits.

The design and fabrication of a new digital integrated circuit involves a series of sequential steps. First, using available software design tools, a schematic diagram of the desired integrated circuit is constructed. Secondly, the operation of the designed circuit is simulated on a computer with available simulation software. Such a simulation involves performing a number of discreet tests on the designed circuit. Each test includes application of a sequential series of signals (test vectors) to the inputs of the circuits, and then comparing the outputs of the circuits with expected output test vectors. If the simulation does not provide the desired results, the circuit design schematic is altered and the simulation again performed. This cycle is repeated until the simulation demonstrates that the circuit is providing the desired results.

Once the designer is satisfied that the circuit schematic is correct and will result in an integrated circuit that operates in the desired manner, a third basic step in the design cycle is to lay out the masks, using available software tools, that are to be used in fabricating the integrated circuits. Once the masks are completed, the tooling necessary for manufacture of the integrated circuits is made. A large number of the circuits are formed at one time on a single semiconductor wafer. The wafer is then separated into individual circuit die (chips) which are then individually packaged. Each package has many pins, which can number from as few as a dozen to as many as a hundred or more, which are electrically connected to various points on the internal integrated circuit chip.

It is usual that each circuit chip is tested at least once by the manufacturer before shipment to the customer. This routine is generally always performed on the finished, packaged product, but may additionally be performed on a circuit die before packaging. Automatic test equipment (ATE) is commercially available for performing such tests. The Sentry model 20/21, available from Schlumberger, is among the most popular test equipment. Each different model of ATE available from various manufacturers operates somewhat differently and has specific, unique requirements for an input test program that will cause the equipment to perform desired tests on a specific integrated digital circuit.

Initially, such ATE was programmed essentially from scratch for each new integrated circuit that was desired to be tested on the equipment. That is, a number of individual tests were designed by providing a list of input test vectors (signals) and a set of desired output test vectors directly in the specific format required by an individual piece of equipment to be utilized. More recently, various software tools have become available to automate at least a portion of the design cycle. Such software begins with the simulation test vectors used by the circuit designer to simulate several specific operations of the logic being designed. Available test equipment, however, is far less flexible than logic simulation programs. That is, the test engineer designing a test program to be implemented on the Sentry model 20/21, or other test equipment, is faced with many limitations and restrictions with which the circuit designer does not have to deal. As a result, existing software techniques for automatically converting the simulation tests into a form that can be executed on an actual circuit with ATE are not fully automatic. A great deal of work still remains for a test engineer which can take weeks or months to design and debug a test program for a new circuit. Since the ability to test circuits must exist before the circuits can be sold, a semiconductor manufacturer often must delay introduction of a new product, that is otherwise manufacturable, in order to allow time for an appropriate test program to be developed.

Accordingly, it is a primary object of the present invention to provide an improved software tool for developing a test program for a new integrated circuit product in a reduced amount of time and with less individual test engineer effort being required.

It is an additional object of the present invention to provide an improved test program generation software that is flexible and easy to use, provides abundant diagnostic aids, conserves memory, and has a high speed of execution.

SUMMARY OF THE INVENTION

These and additional objects are accomplished by the present invention wherein, briefly and generally, a computer program is provided for generating from the test vector files used to simulate a particular new circuit during its design, a test vector file as part of a test program for execution on a specific piece of automatic test equipment. The improved computer program accomplishes the aforesaid objects by providing a unique overall program architecture and individual features.

According to one specific aspect of the present invention, a program architecture is provided with preliminary processing of simulation test vector files in a manner independent of the actual test equipment which the resulting test vectors and program will utilize, a memory storing the pre-processed data in a manner that subsequent post-processing can adapt that data to form test vectors and a test program that are acceptable to a particular piece of test equipment with all of its limitations.

According to another specific aspect of the present invention, separate ATE test vector files which normally result from individual, separate simulation test vector files, are combined together to form a single test vector file and test program for a particular integrated circuit to be tested. The composite test vector file and test program utilize a common set of reference timing files, thus greatly simplifying the operation and structure of the computer program.

According to yet another aspect of the present invention, a comparison of timing edges as part of the computer program is accomplished by first converting binary representations of timing edge integers into ASCII characters with an inherent fraction of the number of binary bits necessary to represent them. The speed of performing a comparison and the amount of memory required for doing so is thus significantly reduced.

Additional features, aspects and advantages of the present invention will become apparent from the following detailed description of a preferred embodiment thereof, which description should be taken in conjunction with the accompanying drawings.

BRIEF DESCRIPTION OF THE DRAWINGS

FIG. 1 generally illustrates the connection of an integrated circuit device under test to automatic test equipment which performs tests on the circuit;

FIG. 2 generally illustrates a computer system upon which the improved computer program of the present invention operates to generate a test vector file and test program to drive a specific piece of automatic test equipment for testing a specific electronic circuit;

FIG. 3 illustrates the general flow and architecture of processing by the improved computer program of the present invention;

FIG. 4 is an example of data obtained from a circuit designer which is provided as an input to the processing illustrated in FIG. 3;

FIG. 5 illustrates the format of tables resulting from an initial operation in the processing of FIG. 3;

FIGS. 6(A-B) are flow diagrams illustrating a preliminary processing step of FIG. 3;

FIG. 7 illustrates a look-up table utilized in the process of FIG. 3;

FIG. 8 illustrates another look-up table used in the process of FIG. 3;

FIG. 9 shows the application of the look-up table of FIG. 8 to specific example data given in FIG. 4;

FIG. 10 outlines the overall structure of an intermediate memory used in the process of FIG. 3;

FIG. 11 shows the format of one portion of the memory of FIG. 10;

FIG. 12 is a flow diagram illustrating a post-processing step of FIG. 3;

FIG. 13 illustrates one of the operational steps of the process illustrated in FIG. 12;

FIG. 14 is a flow diagram showing details of another of the operational steps of FIG. 12;

FIG. 15 illustrates the format of a memory file whose data is provided by the post-processing illustrated in FIG. 12;

FIG. 16 illustrates the format of one of the output data files of the processing of FIG. 3; and FIG. 17 illustrates the format of yet another output data file of the processing of FIG. 3.

DESCRIPTION OF A PREFERRED EMBODIMENT

Referring initially to FIG. 1, as background, a packaged semiconductor chip 11, a device under test (DUT), is shown to have only 12 pins for simplicity of explanation. These pins are individually numbered. Each of these pins is individually connected with a unique one of the terminals (also individually numbered) of a piece of automatic testing equipment (ATE) 13. The ATE 13 can be selected from among several commercially available pieces of test equipment, the most popular being the Sentry model 20/21, used as the example in this embodiment. Any such equipment has a monitor 15 and various peripherals 17 connected with it. The ATE 13 is controlled by a test program and test vector database which have been formulated for the purpose of conducting certain specific tests on the integrated circuit 11. A large number of production package integrated circuits are tested one at a time by the test implementation illustrated generally in FIG. 1.

The remaining portion of this description deals primarily with improved techniques for generating a test program and associated test vector database for controlling the ATE 13 to execute a specific series of tests on ant given digital integrated circuit 11. That test program and test vector database are developed by use of a process outlined in FIG. 3, a resulting test program being indicated at 19 and the associated test vector database being indicated at 21. This result is obtained by executing the process illustrated in FIG. 3 as a computer program on a standard computer system, an example of which is shown in FIG. 2.

Connected to a common system bus 23 (FIG. 2) is a central processing unit 25, read only memory 27, and a substantial amount of random access memory 29. Additionally, a hard disk storage device 31 is connected to the bus 23 through a disk controller 33, a monitor 35 through an input/output circuit 37, and a keyboard 39 through another input/output circuit 41. The program illustrated in FIG. 3 that is being executed by a computer system of FIG. 2 resides initially in disk storage 31, and, like any controlling computer program, is called into the random access memory 29 as appropriate for execution. The various data files illustrated in FIG. 3, to be described hereinafter, are initially stored in the random access memory 29, and then, as appropriate, transferred to disk storage media 31.

A starting point for the computer program illustrated in FIG. 3 is input data indicated at 43, a simplified example of which is given in FIG. 4 for discussion purposes. The input data is primarily derived from the test vectors developed for computer simulation of the schematic during the logic design. The input data file 43 contains three basic parts, a header 43, a table 45 providing the format of the circuit pins in operation, .and a number of designer trace files 47, 49, . . .

The header 43 contains general information, primarily of the circuit to be tested. In this example of a 12-pin circuit, the tester cycle time is taken to be 100 nanoseconds.

The table 45 identifies the nature of each of the packaged circuit pins and control signals by providing arbitrary signal reference numbers in the first column to identify each. Signal reference numbers 1-4 identify signals applied to a four-bit address-data bus. Whether the four identified pins are acting as input or output pins is designated by signal reference number 5. A read/write signal pin is identified by signal reference number 6 and an output pin by signal reference number 7. Signal reference number 8 is a control signal that designates whether the output signal reference number 7 is to be masked or not. Signal reference numbers 9 and 10 correspond to voltage supply pins of the product. Signal reference numbers 11-14 designate four output pins whose signals are represented in hexadecimal format.

Each of the trace files 47, 49, . . . identifies the test vectors for an individual test of the circuit that was performed by the circuit designer when simulating its operation on a computer. Referring to the first trace file 47, as an example, a test vector is expressed at each time in the testing cycle where an edge of one or more digital signals exists. The test vector shows the values of the digital signals that are to be applied to input pins of the circuit 11 under test, as well as bits indicating the expected value of its output pins at that same instance in time. The first column of the vectors in the trace file 47 indicates the values of a bit for signal reference number 1 of the data format table 45, the second column for signal reference number 2, and so forth. Each vector of the trace files represents the value of the signal at each pin of the device, plus the value of control signals, at each time in the testing cycle indicated in the "time" column.

During the design of each digital integrated circuit of the type being considered herein, dozens of individual trace files, such as the trace files 47 and 49, are developed. Each trace file contains vectors for testing a specific small portion or function of the circuit. In the course of the initial design of the circuit, each trace file is separately run against the circuit schematic database and the results of the circuit operation noted before the next trace file is run.

The current technique in using these trace files is to develop a series of test vectors to be used with an ATE is to form a separate test vector file for each trace file. Each ATE test vector file exists separate from all others, and is used one at a time to test actual devices, just as the corresponding trace files are used one at a time to conduct a computer simulation of the circuit schematic during the design phase. Each ATE test vector file and associated test program, according to current practice, then stands alone with its own header, signal edge timing files, and the like. As described below, the process described with respect to FIG. 3 and the other drawings results in a single test vector file for any given integrated circuit to be tested, that file including the test vector sequence corresponding to each of the designer trace files 47, 49, etc., with a reference to a common signal edge timing, file, header and other such circuit data that can be shared among the various tests.

Referring again to FIG. 4, the input data format table 45 includes columns "Time 1", "Time 2", and "Strobe". These allow the circuit designer to insert signal timings for selected pins that are to be utilized regardless of the test vectors in the various designer trace files. Entries in these columns designate edge timings of signals which will override, for the signal reference number to which they are applied, the signals specified by the test vectors of the trace files 47, 49, etc. These timings are also carried forward and incorporated in the resulting test vector file 21 that is used with the ATE to test actual devices.

In addition to those overriding signals, the test engineer has an opportunity to insert others during some preparatory processing 51 of the input data 43, as indicated by an arrow 53. The test engineer can record a Table B, as indicated by table 55 of FIG. 5. This table is stored as part of a data file 57. Thus, a great deal of flexibility exists for designating the test vector data upon which the software system of FIG. 3 automatically operates to generate the ATE test vector file 21 and associated test program 19.

The preparatory process 51 also causes the header 43' of FIG. 5, corresponding to header 43 of FIG. 4, to be stored in the data file 57. A data format, Table A, indicated at 59 of FIG. 5, is similar to table 45 of the input data files 43, except that the preparatory processing 51 has expanded the table somewhat. A tester pin number column is added, and the signal reference numbers 11–14, represented together by in table 45 of FIG. 4, are expanded into their individual pins, in the last four lines of table 59.

Referring again to the overall computer program architecture diagram of FIG. 3, a first major part of the processing is indicated by a circle 61. The preliminary processing of this system utilizes the header 43 and designer trace files 47, 49, . . . of the data file 43, and the header 43', data format table 59, and any data format table 55, from the data file 57. These data inputs are used by the preliminary processing 61 to calculate intermediate quantities and develop intermediate data tables which are stored in a memory file 63. The preliminary processing 61 is only minimally dependent upon the choice of ATE equipment 13. The preliminary processing 61 almost exclusively performs the portion of the necessary processing that must be done for any of several commercially available models of the ATE 13.

Subsequently, that pre-processed data is utilized in post-processing 65 to generate a test vector file 21 that is specific to a given model of ATE 13. Also, another data file 67 is generated from the post-processing. The data file 67 is utilized by test program processing 69, along with test program module 71, to generate a test program 19 that is specific to a particular model of ATE 13. An advantage of this computer program architecture is that the various specific processing tasks can be optimized, while at the same time allowing easy updates to generate ATE test vectors for new designer trace files and minimize the amount of data that must be maintained for providing test vectors for testing a given circuit.

The preliminary processing 61 is illustrated in detail in the flow diagram of FIG. 6, represented in two parts, FIGS. 6A and 6B. The pre-processing is illustrated to use the data of designer trace file 47 (FIG. 4) as an example. This example has selected 100 nanoseconds as the time length of a testing cycle of the ATE 13 to be used. This is a common tester cycle of a number of models of available ATE's. The vectors of the trace file 47 are divided into 100 nanosecond cycle groups. A first step 75 in the processing of FIG. 6 is to designate the first time cycle number 1 for processing of the data therein. Also, the step 75 designates the first signal reference number 1 for processing. The test data is processed for each pin in sequence, one at a time, for the first cycle time, and then for the second cycle time, and so forth, until all the data of the trace file 47 has been processed. The step 75 designates the starting point of this processing.

A next step 77 reads the information in the "pin type" column in the data format table 59 of the file 57. Also read from that file, in a step 79, are the data bits within cycle number 1 for that signal reference number. In this case, referring to table 47 of FIG. 4, there are three bits "111". A series of steps 81, 83, and 85 each initiates a different sequence of processing steps, depending upon whether the pin type read from table 45 is an input/output type (step 81), an output type (step 83), or an input type (step 85). In the case of the first signal reference number 1 in our example, the pin signal is an input/output type, so that a step 87 follows the step 81 in the flow of FIG. 6A. Step 87 examines the value of the bit in the signal reference number 5 position which designates whether that pin is currently operating as an input pin or as an output pin. If operating as an output pin, a next step 89 examines whether the data bits are valid, and a subsequent step 91 looks at the signal reference number 8 bit value to determine whether that output is to be masked during this first cycle time. If either the data is invalid, or the mask bit is set, the output value is masked, as indicated at 93. Conversely, if the data is both valid and the mask bit is not set, processing proceeds along a path 95.

If the pin being processed is not an input/output type, but rather is an output type, such as signal reference numbers 7 or 11-14 of the example of data format table 59, then the processing proceeds from step 81 to step 83. Step 82 causes the processing to proceed by a path 97 to the step 89. The processing steps 89 and 91 are then accomplished in the manner described above.

As a third possibility, if the pin is an input type, such as signal reference number 6 of data format table 59, the processing proceeds through steps 81, 83 and then to step 85. The result is that the processing increments to another step 99. The processing can reach step 99 in another way, namely through a path 101 from a step 87 when an input/output type is determined by it to be operating as an input type. However, when the step 85 determines that the subject signal reference number does not represent the input pin, an error must be indicated since a combination of steps 81, 83 and 85 should account for all pin types. Proceeding in a path 103 from the step 85 indicates that the current signal reference number is none of the three allowed types. The result is to note the error, in a step 105, by writing to a pre-process log 107 (FIG. 3) to alert the test engineer of this problem. Meanwhile, the processing continues by execution of a step 107 to increment to the next signal reference number in order, and begin processing of that.

Assuming that one of the three valid pin types has been read from the data format table 59, the next step 99 identifies whether data for the current signal reference number is in hexadecimal form. If so, it is converted by a step 109 into a binary form before proceeding. This is the case in the example being given for any of signal reference numbers 11-14.

A next step 111 determines the format of the signal at the pin identified by the current signal reference number. The available formats are indicated in FIG. 7, and are well known in the automatic test equipment art. A limitation of most models of the ATE 13 is that the test signal on a pin of the device must remain in one of the four formats shown in FIG. 7 throughout a test. Designating the format is a way of compressing the data of a designer trace file by designating a format for the signal at each pin which the ATE 13 will recognize.

In order to assure that the format of a given signal reference number is not changed, steps 113 and 115 will write in the memory file 63 the value of the format for the signal if one does not already exist. If such a format has already been recorded in memory file 63, a step 117 compares the current calculated format with that previously recorded. It should be the same. If it is, the processing proceeds to a step 119. If not, another flag is sent to the pre-processed log 107 (FIG. 3) by a step 121, and then the processing continues.

A step 119 looks to see whether there is any data in Table B, indicated at 55 in FIG. 5. If so, this data is read in a step 121 and will control the timing presented to the ATE 13 for the designated pin or pins, regardless of the data in the trace files, as previously described.

A next step 123 further compresses the data of the trace file 47 (FIG. 4) by substituting an appropriate single character given in columns (2), (3) or (4) of FIG. 8, in a row corresponding to a match between column (1) of FIG. 8 and the specific bit pattern for the pin corresponding to the signal reference number currently being evaluated and the current cycle number. For example, with reference to trace file 47, signal reference number 1 contains a pattern of "111" in time cycle number 1. By reference to data format table 59, it is determined, in this example, from signal reference numbers 1 and 5, that this pin is operating as an input pin. Thus, the filtered byte for the first signal in the first cycle time is the number 1. This is indicated in a table of FIG. 9. Also indicated in FIG. 9 is the filtered data byte for each of the other circuit pins, by signal reference number, for time cycle number 1 of the trace file 47.

It will be noted that the results of two calculations, namely the signal format and its filtered byte, are written to the intermediate memory 63 at steps 115 and 123. A structure of the memory 63 is indicated at FIG. 10 for reference. The memory is structured in seven parts, designated S01-S07. The format is written at step 115 into part S05. The filtered byte is written by step 123 as one character in a string of characters in an "input/output data" column of FIG. 11 which represents the format of the portion S07 of the memory 63 indicated in FIG. 10. It will be recognized that the first series of bytes, for cycle time number 1, indicated in FIG. 11, is that shown to be calculated by FIGS. 8 and 9 for cycle time number 1 of the example designer trace file 47.

Once these values are calculated for storage in the memory 63, the next step 125 determines whether the signal reference number just evaluated is the last of the pins to be evaluated for the current cycle time, in this case, cycle time number 1. If not, a step 107 increments the current pin number of the process to the next in order within the current cycle time and all of the steps of the process just described are repeated for that pin and its signal data during the current cycle time.

However, if the pin just evaluated is the last of those to be evaluated for the current cycle time, then the processing proceeds to a series of steps indicated in FIG. 6B. These steps characterize the timing of transition edges of the signals on all the pins in each of the cycle times the information as to the position of each transition within the 100 nanosecond cycle time. With reference to cycle time number 1 of the trace file 47 of FIG. 4, it can be seen that there is a transition at 26.5 nanoseconds of signal reference numbers 2 and 6. Similarly, at 85.0 nanoseconds, there is also an edge of the signal reference numbers 2 and 6. This information of the edge positions, along with the formats (FIG. 7) and filtered data (FIGS. 8 and 9), fully characterize the various signals in cycle time number 1 in a way that is recognized by commercial models of the ATE 13.

What is done by the process illustrated in FIG. 6B is to record the time and pin numbers of the edges in portions S05 and S06 (FIG. 10) of the memory file 63. Space is provided for recording up to four transitions for each pin during each tester time cycle. Sixteen bits are required to record the integer representing the time of just one cycle edge, so it can be seen that this is a potentially huge amount of binary data.

In addition to this data of the edges, those cycle times having the same relative edge timings within them are grouped together and identified by a common time set (TS) number. This TS number is also stored, as indicated in FIGS. 10 and 11, in memory 63 portions S05, S06 and S07.

Referring to FIG. 6B, the processing steps which group together cycle times of common edge timing are illustrated. A step 127 compares the edge timing of all of the current pin signals within the current cycle time with those of any previous cycle times. If there is no match, as determined by a step 29, a step 31 causes the timing of the current cycle time to be identified by a new time set (TS) number. A new time set file is then established, in a step 133, to which the next in order TS number is assigned. However, if there is a match, as indicated by a step 135, the number of the previously established TS number having those same edges is then used to identify the edges of the current time cycle as well.

At the conclusion of the operation indicated by steps 133 or 135, the current cycle time has been fully evaluated and data characterizing it in a manner that can be used to generate ATE test vectors has been recorded in the file 63. A next step 137, therefore, is to determine whether all of the cycle times of the current trace file have been evaluated. If so, the process has been completed. If not, the process is incremented by a step 139 to the next cycle time in order. The processing then resumes for the first pin in the new cycle time with a step 77.

It can be seen from the processing of FIG. 6 that the memory file 63 now contains data from a given trace file 47, in this example, that is characterized in a manner that many models of automatic test equipment recognize. That is, the various signals and timing are characterized by their format, filtered bytes, time set numbers and timing edges within each time set. Various models of commercially available test equipment differ in the number of different input signals that can be generated and actually applied to a circuit under test, the number of output signals that are generated for comparison with the outputs of the circuit under test, and the total number of different time sets that are available. There are other varying limitations as well, but these are the major ones.

With reference to the Sentry model 20/21 test equipment, only 16 timing sets are available from which actual input or output test vectors can be generated. Only twelve different timing generators (TGs) are available for generating input signals to a device under test, and only four are available for generating output signals. Since the test vectors of a trace file designed and used in computer simulation of a schematic during a circuit design have no such limitation, it is often the case that many more time sets are included in the test vectors than can be handled by the test equipment. Thus, a primary purpose of the post-processing 65 (FIG. 3) is to convert the partially evaluated data in the memory 63 to that which fits within the limitations of a specific model of test equipment being used, such as the Sentry model 20/21. The post-processing 65 converts that data into a test vector file 21, which is directly applied to the ATE 13, and a data file 67, which is used to generate the ATE test program 19 and to allow easy updating of the various files that are generated as the end result of this processing.

Referring to FIG. 12, the steps of the post-processing 65 are generally illustrated in a flow diagram. A first step 141 rearranges the data of memory 63 portion S05 in a manner illustrated in FIG. 13. By identifying the timing of the edges of each device pin, those having signals with substantially the same timing can be automatically grouped together in a step 143. The purpose of the step 143 is to find those pins having common signal timings so that they may be grouped together for connection to one of a limited number of timing generators (TG) within the ATE 13.

Referring to FIG. 14, the process of the step 143 of FIG. 12 is provided in detail. A first step 145 is to read from the memory 63 the cycle time being used. In this example, it is 100 nanoseconds. A quantity C is calculated by multiplying that cycle time A by two percent. A next step 47 divides the quantity C by 5, and if the result is equal to zero, processing proceeds to a next step 149. If the result is not equal to zero, however, C is rounded up to the next multiple of 5, giving a quantity C'.

The step 149 is the first to be performed for a current pin being evaluated. A quantity D is calculated by dividing the quantity B by either C or C', whichever is applicable. If the quantity D is an integer, as determined by a step 151, the processing proceeds to a next step 153. If D is not an integer, however, it is rounded up to the nearest integer and designated D'.

A step 153 has a purpose of converting the integer D or D' into an ASCII character. This is accomplished in step 153 by adding 33 to either the quantity D or the quantity D', whichever is applicable. The quantity E is then stored in a temporary memory file. Since it has been converted to an ASCII character, it can be stored with one byte of binary information. This quantity is then used later in the processing for comparison purposes. The storage space required is reduced and the speed at which such a comparison can be made is greatly increased when each edge is represented by a single byte of information rather than the four bytes required to directly represent the edge timing integer.

A step 155 inquires whether all edges for a given pin have thus been processed. If not, the cycle of steps 149-153 is repeated for the next pin in order to which the processing is incremented by a step 157. However, once all of the edges of a given pin have been evaluated, the processing proceeds to a next step 159.

It is in the step 159 where all of the edges of the pin just evaluated are compared, through their individual quantities E, to the same quantities of previously calculated pins. If there is not a match, this first occurrence of a unique pin timing is identified by a new group number in a step 163. However, if there is a match with a previous timing, the question is then asked as to whether the current pin and the pin or grouping of pins with whom the timing matches are both input or output. If not, the processing proceeds to step 163 to designate a new group for the current pin. However, if they are of input or output, a step 167 then groups the current pin with the prior group of pins. That is, the group number of pins whose timing is the same as the current pin is also given to the current pin.

The reason for limiting the membership of any group to pins which are either all input or all output pins is the requirement of the example Sentry model 20/21 test equipment. Only input pins or output pins, not a combination of both, can be grouped for the purpose of designating a specific ATE test generator for a single group. Further, because of the two percent factor utilized in step 145, pins that are combined into a single group need not have exactly all the same timing edges, but are grouped together because their timing edges are within two percent of each other. This two percent figure, of course, can be altered, but should be kept at about the resolution limit of the test equipment to be utilized.

Once a current pin has been grouped as described, a next step 169 inquires whether the timing for all pins has been treated. If so, the process is over. If not, a step 171 increments to the next pin in order. The steps 149 through 167 are then performed for that next pin.

Returning to the flow diagram of FIG. 12, a next step 173 applies the available timing generators to each of the groups of pins formed by the process of FIG. 14 just described. The rules of such test generator (TG) assignment for the Sentry model 20/21 are well known. Its test generators are grouped into two groups, A and B. All of the first eight consecutive circuit pins must be driven by one or more test generators in group A, the next seven pins by test generators in group B, the next eight pins by test generators in group A, and so forth. This timing generator assignment process continues until either all the groups of pins are exhausted or all available test generators are exhausted. If the latter case exists, as indicated in step 175, the test engineer is then provided with the opportunity to combine groups of pins whose timings are close enough to make such combination acceptable. For example, one group of pins could have all the same or substantially the same timing edges except for one edge. The test engineer, within his or her judgment, may adjust one or both of these timing edges so that they become the same. The groups are then merged. This may be done several times until the number of groups of pins matches the number of test generators that are made available in the ATE 13.

Once each of the groups of pins has been matched with a test generator, either automatically by the process of step 173, or with the additional manual process of step 175, the resulting test groups are recorded in the memory 67, as indicated by a step 177, and illustrated as sections (A) and (B) of FIG. 15. The table (A) of FIG. 15 that is stored in the memory file 67 lists only those pins where some change in signal occurs during the test. The table (B) of FIG. 15 of the test or data file 67 identifies the Sentry model 20/21test generator assignments by pin number.

Steps 179 and 181 of the post-processing of FIG. 12 define the registers for the ATE 13 and DC set-up tests, respectively, as is currently being done. The results of these calculations are stored in sections (C) and (D) of the test or data file 67 illustrated in FIG. 15.

An example of the format of the test vector file 21 (FIG. 3) is illustrated in FIG. 16. The data in the test vector file 21 is derived through the post-processing 65 from the data file 63. The format shown in FIG. 16 is suitable for directly driving the Sentry model 20/21 test equipment.

As a result of the preferred embodiment of the processing described so far, a single trace file 47 (FIG. 4) has been converted into a form so that the actual circuit chip can be driven by the ATE 13 through the test sequence designated by the trace file. For the second trace file 49, the same process can be completely and independently performed. The process can then be independently performed for additional trace files.

However, it has been found to be quite advantageous to share resources in generating a test vector file and test program for a single integrated circuit product from several designer trace files. Therefore, as indicated by a dashed path 183 of FIG. 3, data from the memory file 67 corresponding to the first trace file is used by the preliminary processing 61 of data from the second trace file. Specifically, step 127 of FIG. 6B refers to the time sets already generated for the first trace file, and builds upon those time sets so that there is a single group of time sets for all of the trace files for a given integrated circuit.

Further, as indicated by dashed line 185, some of the memory file 67 data resulting from calculations of prior trace files is also used in the post-processing. Specifically, the groupings of pins and assignments of ATE test generators are utilized in post-processing steps 173 and 175 of FIG. 12.

In addition to generation of what is necessary to drive a specific model of automatic test equipment, the software process shown in FIG. 3 includes separate report processing 187 that takes data from the files of the memory 63 and converts them into files and/or reports 189 and 190 which are useful to the test engineer for diagnostic purposes. The format of the file 189 is given in FIG. 17. The indicated arrangement of data is very useful to a test engineer. The file 191 expresses the same information but essentially turned 90 degrees in order to show the waveforms of signals at specific identified pins of the integrated circuit under test.

An example in source code of a computer program for developing a test program that utilizes the foregoing features is being submitted herewith in microfiche form as an appendix. A claim of copyright is made by Zilog, Inc., assignee of the present application, to this microfiche appendix. This assignee has no objection to the duplication of the microfiche appendix by photocopying and the like but reserves all other copyright therein.

Although the present invention has been described with respect to a preferred embodiment thereof, it will be understood that the invention is entitled to protection within the full scope of the appended claims.

It is claimed:

1. A method of testing integrated circuits of a, given design on automatic testing equipment having a preset number of independent test signal generators, comprising the steps of:

(a) acquiring at least first and second designer trace files for said given design that each includes a plurality of test vectors of (i) individual input pin digital signals and (ii) expected responsive individual output pin digital signals, both of said input signal and output signal test vectors representing respective at least first and second operations of said integrated circuits of the given design, (b) processing the test vectors of said first designer trace file by calculating at least a format of the digital signals of various pins, by calculating filtered bytes of the test vectors, and by grouping together into common time sets those test vectors having substantially the same signal edge timing characteristics, and then storing the results of the calculations and grouping in an intermediate memory file, (c) subsequently processing said first designer trace file calculation results stored in the intermediate memory file by grouping together said results of those pins of the circuit having substantially the same edge timing of their digital signals, thereby forming a plurality of groups, and assigning one of the test signal generators of the automatic testing equipment to each of said groups, (d) processing the test vectors of said second designer trace file by calculating at least a format of the digital signals of various pins, by calculating filtered bytes of the test vectors, and by grouping together into common time sets, by reference with time sets from the results of groupings from said first trace file test vectors, those test vectors having substantially the same signal edge timing characteristics, and then storing the results of the calculations and grouping in said intermediate memory file, (e) subsequently processing said second designer trace file calculation results stored in the intermediate memory file by grouping together said results of those pins of the circuit having substantially the same edge timing of their digital signals, said grouping being accomplished by reference to the groupings formed from the first trace file, and assigning one of the test signal generators of the automatic testing equipment to any such group to which a test signal generator was not assigned when processing the first trace file, and (f) causing said automatic testing equipment test signal generators to generate test vectors in accordance with the results of the processing of said at least first and second trace files, said causing step including an'application of input test vectors to input pins of one of said integrated circuits, and comparing test vectors from the output pins thereof with expected output test vectors, thereby to test operation of said integrated circuits in accordance with said at least first and second designer trace files.

2. A testing method according to claim 1 wherein logic signal edge timing is maintained as a binary representation of an integer and the subsequent processing steps (c) and (e) of grouping together said results of those pins of the circuit having substantially the same edge timing of their digital signals each include the steps of converting the integer binary representation of the edge timing to ASCII characters and then comparing the edge timing of various signals by comparing their ASCII characters, thereby to effect said comparison by edge timing representations that utilize a reduced number of bits.

3. A testing method according to claim 1 wherein the processing of steps (b) and (d) each additionally include the step of manually inserting test vector timing information which overrides that from the designer trace files.

4. A method of testing replicas of an integrated circuit of a given design on automatic testing equipment having a preset number of independent test signal generators, comprising the steps of:

(a) acquiring at least first and second test files for said given design that each includes a plurality of test vectors of (i) individual input digital signals by pin number of said integrated circuit, and (ii) expected responsive individual output digital signals by pin number of said integrated circuit, both of said input signal and output signal test vectors representing respective at least first and second operations of said integrated circuit, (b) processing the test vectors of said first test file by at least categorizing into common time sets those test vectors of digital signals having edges with timing characteristics that are substantially the same, and then storing results of the categorization in an intermediate memory file, (c) subsequently processing the results of step (b) stored in the intermediate memory file by grouping together said results of those pins of the integrated circuit carrying digital signals having edges with timing characteristics that are substantially the same, thereby forming a plurality of groups, and assigning one of the test signal generators of the automatic testing equipment to each of said groups, (d) processing the test vectors of said second test file by at least categorizing into common time sets, by reference with time sets of step (a), those test vectors of digital signals having edges with timing characteristics that are substantially the same, and then storing the results of the categorization in said intermediate memory file, (e) subsequently processing the results of step (d) stored in the intermediate memory file by grouping together said results of those pins of the circuit carrying digital signals having edges with timing characteristics that are substantially the same, said grouping being accomplished by reference to the groupings of step (c), and assigning one of the test signal generators of the automatic testing equipment to any such group to which a test signal generator was not assigned in step (c), and (f) causing said automatic testing equipment test signal generators to generate test vectors in accordance with the results of the processing of said at least first and second test files, said causing step including an application of input test vectors to input pins of individual replicas of said integrated circuit, and comparing test vectors from the output pins of such replicas with expected output test vectors, thereby to test operation of said integrated circuit replicas in accordance with said at least first and second test files.

5. The testing method according to claim 4 wherein the vector signal edge timing characteristics are maintained as a binary representation of an integer and the processing steps (c) and (e) each include the steps of converting the integer binary representation of the vector signal edge timing characteristics to ASCII characters and then comparing the edge timing by comparing their ASCII characters, thereby to effect said comparison by edge timing representations that utilize a reduced number of bits.

6. The testing method according to claim 4 wherein step (b) additionally includes the step of inserting, into the processing of test vectors of the first test file, other test vectors not included in the first test file and which override those from the first test file, and wherein step (d) additionally includes the step of inserting, into the processing of test vectors of the second test file, other test vectors not included in the second test file and which override those from the second test file.

* * * * *